(12) United States Patent
O'Brien et al.

(10) Patent No.: US 11,940,519 B2
(45) Date of Patent: Mar. 26, 2024

(54) METHOD AND SYSTEM FOR DETERMINING A MAGNETIC SUSCEPTIBILITY DISTRIBUTION

(71) Applicants: Siemens Healthcare GmbH, Erlangen (DE); The University of Queensland, Brisbane (AU)

(72) Inventors: Kieran O'Brien, West End (AU); Jin Jin, Chapel Hill (AU); Steffen Bollmann, St Lucia (AU); Markus Barth, St Lucia (AU); Francesco Cognolato, Casalserugo Pd (IT)

(73) Assignee: Siemens Healthineers AG, Erlangen (DE)

( * ) Notice: Subject to any disclaimer, the term of this patent is extended or adjusted under 35 U.S.C. 154(b) by 120 days.

(21) Appl. No.: 17/725,610

(22) Filed: Apr. 21, 2022

(65) Prior Publication Data

US 2022/0342022 A1     Oct. 27, 2022

Related U.S. Application Data

(60) Provisional application No. 63/177,719, filed on Apr. 21, 2021.

(51) Int. Cl.
*G01R 33/56* (2006.01)
*G06N 3/045* (2023.01)
(Continued)

(52) U.S. Cl.
CPC ......... *G01R 33/5608* (2013.01); *G06N 3/045* (2023.01); *G06N 3/084* (2013.01); *G06V 10/82* (2022.01)

(58) Field of Classification Search
CPC .... G01R 33/5608; G06N 3/045; G06N 3/084; G06V 10/82
See application file for complete search history.

(56) References Cited

U.S. PATENT DOCUMENTS 9,285,449 B2   3/2016 Liu et al.
9,448,289 B2   9/2016 Wang et al.
(Continued)

FOREIGN PATENT DOCUMENTS

WO    2016209930 A1    12/2016

OTHER PUBLICATIONS

Cognolato F. et al; "NeXtQSM—A Complete Deep Learning Pipeline for Data-Consistent Quantitative Susceptibility Mapping Trained With Synthetic Data"; Nov. 2022; https://doi.org/10.1016/j.media.2022.102700; https://submissions2.mirasmart.com/ISMRM2021/ViewSubmissionPublic.aspx?sei=HgcTdXQax.

*Primary Examiner* — Gregory H Curran
(74) *Attorney, Agent, or Firm* — Banner & Witcoff Ltd.

(57) ABSTRACT

A training method for training neural networks to determine a magnetic susceptibility distribution of a sample may include: storing a simulated magnetic susceptibility map of the sample, generating a modified magnetic susceptibility map by combining an influence of one or more external magnetic susceptibility sources with the simulated magnetic susceptibility map and storing the modified magnetic susceptibility maps. The method may include generating a first training image by applying a quantitative susceptibility mapping model the modified magnetic susceptibility map and storing the first training image, applying the first neural network to the first image and a second neural network to an output of the first neural network and changing network parameters of the first and the second neural network depending on a deviation of an output of the second artificial neural network from the simulated magnetic susceptibility map.

15 Claims, 5 Drawing Sheets

(51) Int. Cl.
*G06N 3/084* (2023.01)
*G06V 10/82* (2022.01)

(56) References Cited

U.S. PATENT DOCUMENTS

| | | |
|---|---|---|
| 9,542,763 B2 | 1/2017 | Bilgic et al. |
| 11,372,066 B2 * | 6/2022 | Koch ................... A61B 5/7267 |
| 2015/0145515 A1 | 5/2015 | Liu |
| 2015/0338492 A1 | 11/2015 | Sato et al. |
| 2019/0204401 A1 | 7/2019 | O'Brien et al. |
| 2020/0008701 A1 | 1/2020 | Ye et al. |
| 2020/0058106 A1 * | 2/2020 | Lazarus ................ G06V 10/764 |
| 2022/0026516 A1 * | 1/2022 | Guidon ............ G01R 33/56341 |

\* cited by examiner

METHOD AND SYSTEM FOR DETERMINING A MAGNETIC SUSCEPTIBILITY DISTRIBUTION

CROSS REFERENCE TO RELATED APPLICATIONS

This patent application claims priority to, and the benefit of, U.S. Provisional Patent Application No. 63/177,719, filed Apr. 21, 2021, which is incorporated herein by reference in its entirety.

BACKGROUND

Field

The present disclosure concerns a training method for training a first artificial neural network and a second artificial neural network to determine a magnetic susceptibility distribution of a sample, a method for determining a magnetic susceptibility distribution of a sample, a magnetic resonance imaging system, a data processing device and a computer-readable storage device.

Related Art

Magnetic susceptibility describes a sample induced magnetization when placed in a static magnetic field. The measurement of tissue magnetic susceptibility using magnetic resonance imaging, MRI, is of high interest, because magnetic susceptibility contains valuable information about the chemical composition and microstructure of tissues. Quantitative susceptibility mapping, QSM, is a post-processing technique that computes the underlying magnetic susceptibility distribution of a sample from MRI phase measurements by removing the background field caused by strong external magnetic susceptibility sources outside the sample and then solving an inverse problem computing the susceptibility sources within the sample or tissue that caused the measured field distribution.

Document US 2015/338492 A1 describes a magnetic resonance imaging device wherein the computing part includes a measurement unit for detecting the nuclear magnetic resonance signal generated from a subject as a complex signal and an image reconstruction unit for reconstructing a complex image, an image conversion unit for converting the complex image into a magnetic susceptibility image. The image conversion unit includes a complex image conversion unit for creating an absolute value image and a phase image from the complex image, and a magnetic susceptibility image calculation unit for creating the magnetic susceptibility image from the phase image. The magnetic susceptibility image calculation unit includes an edge information magnetic susceptibility image calculation unit for calculating an edge information magnetic susceptibility image indicating an edge of a tissue in a magnetic susceptibility distribution, and an edge mask calculation unit for calculating an edge mask of a tissue from the edge information magnetic susceptibility image.

Document US 2019/204401 A1 describes how to leverage the use of convolutional neural networks or similar machine learning algorithms to predict an underlying susceptibility distribution from MRI phase data, thereby solving an ill-posed inverse problem. This is achieved in accordance with via a DeepQSM technique, which uses a large amount of simulated susceptibility distributions and computes phase distribution using a unique forward solution. These examples are then used to train a deep convolutional neuronal network to invert the ill-posed problem.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
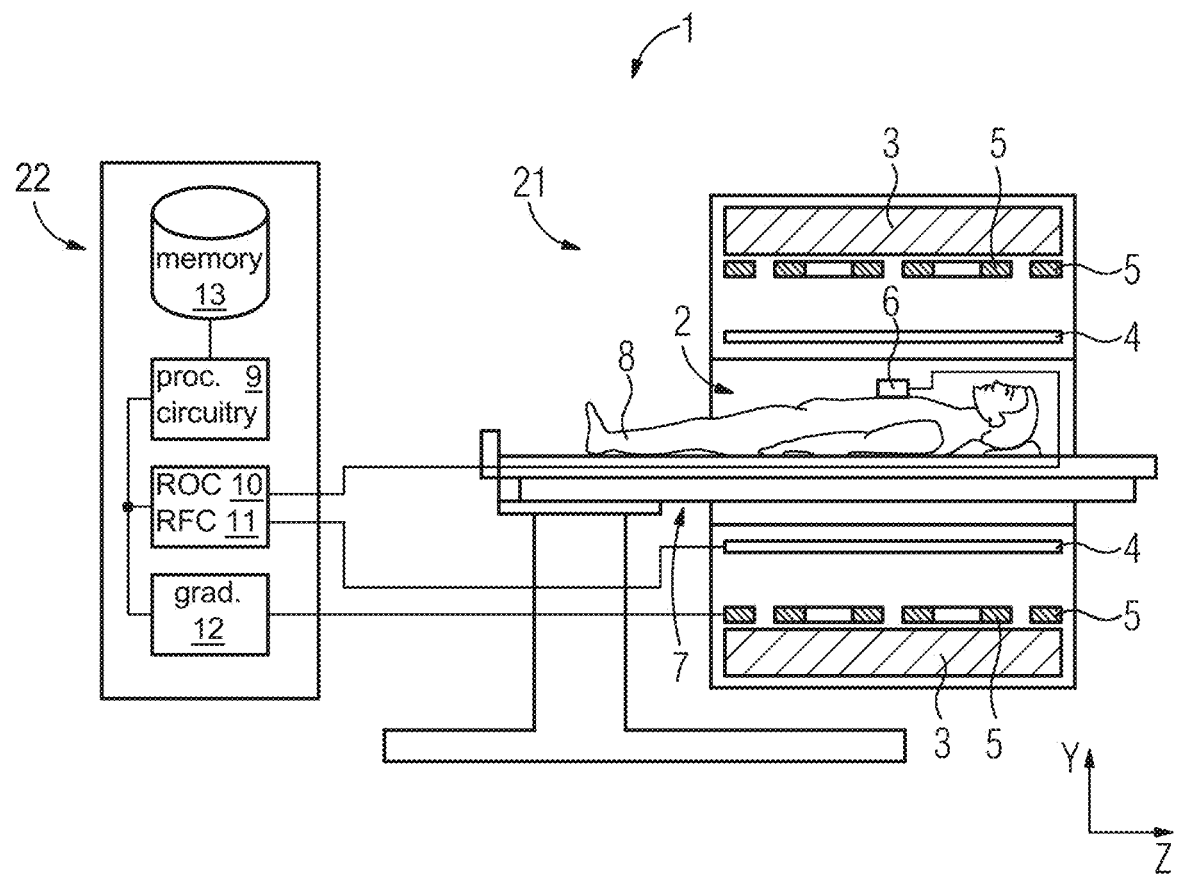
FIG. 1 shows an MRI system according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

There exists a need to determine the magnetic susceptibility distribution of a sample in the presence of external magnetic susceptibility sourced with increased accuracy.

The present disclosure is directed to treating the problems of background field subtraction and dipole inversion in QSM as the interrelated problems they are, because internal sources can also create fields that could be confused as background fields, rather than as separate problems. Subtracting the background field before dipole inversion could cause the removal of sources of interest and lead to incorrect quantifications. Therefore, such separation is not carried out according to the proposed techniques. Rather, a new technique is proposed that utilizes machine learning concepts, such as deep convolutional neural networks, to solve said QSM problems as one optimization task.

An aspect of the present disclosure is directed to a training method for training a first artificial neural network and a second artificial neural network to determine a magnetic susceptibility distribution of a sample. The training method comprises storing a simulated magnetic susceptibility map, for example a simulated magnetic susceptibility map for the sample or of the sample, in a computer-readable fashion, in particular to at least one data storage device, and generating a modified magnetic susceptibility map by combining an influence of one or more external magnetic susceptibility sources with the simulated magnetic susceptibility map and storing the modified magnetic susceptibility map in a computer-readable fashion, in particular to the at least one data storage device. The training method further comprises generating a first training image by applying a predetermined quantitative susceptibility mapping, QSM, model to the modified magnetic susceptibility map of the sample and storing the first training image in a computer-readable fashion, in particular to the at least one data storage device. The data storage device further comprises applying the first artificial neural network, for example in an untrained or partially trained state, to the first training image and applying the second artificial neural network, for example in an untrained or partially trained state, to an output of the first artificial neural network. The training method comprises changing first network parameters of the first artificial neural network and second network parameters of the second artificial neural network depending on a deviation of an output of the second artificial neural network from the simulated magnetic susceptibility map.

The first and the second artificial neural network are, for example, stored to the at least one data storage device in their untrained or partially trained state.

The first artificial neural network may for example comprise a convolutional neural network, for example a fully convolutional network.

An exemplary suitable design for the first artificial neural network is given by the so-called U-net, which is described in the publication O. Ronneberger et al.: "U-Net: Convolutional Networks for Biomedical Image Segmentation.", arXiv:1505.04597v1, 2015.

In an exemplary embodiment, the second artificial neural network may comprise a variational network.

An exemplary design suitable for the second artificial neural network is described for example in the publication E. Kobler et al.: "Variational Networks: Connecting Variational Methods and Deep Learning", in "Pattern Recognition", Springer International Publishing, pp. 281-293.

The sample may for example consist of or contain a tissue, for example organic tissue of a human being or an animal. The external magnetic susceptibility sources may be considered as being external to the sample. For example, the sample itself may contain internal magnetic susceptibility sources also denoted as tissue magnetic susceptibility sources, for example due to magnetic substances such as iron in the tissue. The external magnetic susceptibility sources, however, do not correspond to such internal or tissue magnetic susceptibility sources but may be caused for example by boundaries between the samples, for example the tissue, and surrounding space, for example air. When the sample is placed in a static magnetic field, for example for carrying out a magnetic resonance imaging, MRI, of the sample, the internal magnetic susceptibility sources give rise to a magnetic field distribution, which may also be denoted as tissue field. The external magnetic susceptibility sources give rise to a perturbing field, which may also be denoted as background field. Apart from boundaries between the sample and the surrounding, also other external sources or imperfections in the shimming of an MRI system, in particular a field magnet of the MRI system, may contribute to the background field. Therefore, also such effects may at least effectively be described by the external magnetic susceptibility sources.

The simulated magnetic susceptibility map corresponds to an estimation or simulation for a possible magnetic susceptibility distribution of the sample as it could be caused by the internal magnetic susceptibility sources without an influence of the external magnetic susceptibility sources.

Combining the influence of the one or more external magnetic susceptibility sources with the simulated magnetic susceptibility map may for example understood such that it is computed how the magnetic susceptibility distribution, for example within the sample, would be in case the external magnetic susceptibility sources and the internal magnetic susceptibility sources would be present.

The predetermined QSM model may for example be described by the equation $Y=\Phi X+\varepsilon$, wherein X is the respective object in Fourier space containing the susceptibility values, $\varepsilon$ is the noise during the measurement, Y is the measured local field and $\Phi=F^{-1}DF$ is the so called QSM forward operation, which is a convolution operation with the dipole kernel D in the image domain. For example, but not necessarily, the dipole kernel may be represented by the following equation:

$$D = \frac{1}{3} - \frac{k_z^2}{k_x^2 + k_y^2 + k_z^2},$$

wherein $k_x$, $k_y$ and $k_z$ are the k-space values in the respective directions. When the k-space values fraction approaches ⅓, the dipole kernel results to 0, making the dipole inversion ill-posed.

The QSM model transfers, for example, the modified magnetic susceptibility map into an image which corresponds to a phase image, for example an MRI phase image, of the sample according to the simulated magnetic susceptibility map and the external magnetic susceptibility sources. Consequently, the first training image represents such a total phase image including influences of the internal susceptibility sources and the external magnetic susceptibility sources.

A phase image or MRI phase image may for example be understood such that it corresponds to the phase of a complex MRI signal, which is acquired by means of a corresponding nuclear magnetic resonance technique, for example by an MRI acquisition.

The output of the first artificial neural network corresponds to an output of the first artificial neural network in response to the application of the first artificial neural network to the first training image. The output of the first artificial neural network represents, for example, a tissue phase image of the sample, which corresponds to a phase image or MRI phase image, wherein the influence of the external magnetic susceptibility sources has been removed at least partially compared to the first training image. In other words, the first artificial neural network is trained to remove the influence of the one or more external magnetic susceptibility sources from a total phase image, in particular from the first training image. The effectivity of the first artificial neural network in this respect may, however, evolve or increase during the course of the training.

The output of the second artificial neural network corresponds to an output of the second artificial neural network in response to the application of the second artificial neural network to the output of the first artificial neural network. The output of the second artificial neural network represents a magnetic susceptibility map of the sample. In other words, the second artificial neural network is trained for carrying out a magnetic dipole inversion to transfer the tissue phase image into the magnetic susceptibility map. Also here, the effectivity of the second artificial neural network may evolve or increase during the training.

The network parameters of the first and the second artificial neural network comprise, for example weighting factors and/or bias factors of the respective neural network. The changing of the respective network parameters may be carried out by suitable optimization algorithms, for example back propagation algorithms. For example, changing the first network parameters and the second network parameters may include storing the changed first and second network parameters to the at least one data storage device or, in other words, storing the accordingly updated or changed first and second artificial neural network to the at least one data storage device.

It is noted that the described steps of the training method may be part of a single training epoch for training the first and the second artificial neural network. The described steps may be repeated multiple times, in particular using different simulated magnetic susceptibility maps and/or different one or more external susceptibility sources to improve the performance of the first and the second neural network gradually. The training may, for example, be terminated, once a predefined termination criterion, for example a termination criterion depending on the deviation of the output of the second artificial neural network from the simulated magnetic susceptibility map, is fulfilled.

In the described way, the first and the second artificial neural network are jointly trained to reconstruct the simulated magnetic susceptibility map in terms of the output of the second artificial neural network. In other words, the smaller the deviation between the simulated magnetic susceptibility map and the output of the second artificial neural network, the more advanced is the training state of the first and the second artificial neural network. For example, by carrying out the training method, in particular multiple times, the first artificial neural network is trained to remove the influence of the one or more external magnetic susceptibility sources at least partially and the second artificial neural network is trained for carrying out the magnetic dipole inversion, which corresponds to an inversion of the QSM model.

In respective embodiments of the described training method, the first and the second artificial neural network are trained to fully take background field into account when inverting the dipole solution. With this, a more accurate, robust and fast solution to the ill-posed QSM inverse problem based on single orientation data is achievable. Consequently, fundamental limitations in the clinical application of QSM, namely processing speed and robustness, may be overcome.

In several embodiments of the training method, the first training image corresponds to an artificial magnetic resonance phase image, also denoted as artificial total phase image, including the influence of the one or more external magnetic susceptibility sources.

This may for example be understood such that the first training image mimics a magnetic resonance phase image, including the influence of the one or more external magnetic susceptibility sources and the tissue magnetic susceptibility sources in case an MRI of the sample would have been carried out.

In several embodiments of the training method, the output of the first artificial neural network corresponds to a modified artificial magnetic resonance phase image of the sample, wherein the influence of the one or more external susceptibility sources is removed at least partially. The modified artificial magnetic resonance phase image may also be denoted as artificial tissue phase image.

In several embodiments of the training method, the output of the second artificial neural network corresponds to a reconstructed magnetic susceptibility map of the sample.

In other words, in case the first and the second artificial neural network would operate perfectly, the reconstructed magnetic susceptibility map would be identical to the simulated magnetic susceptibility map. Over the course of the training, this ideal situation is approached or achieved at least approximately, according to the predefined determination criterion.

In several embodiments of the training method, the training method further comprises generating a second training image by applying the predetermined QSM model to the simulated magnetic susceptibility map and storing the second training image in a computer readable fashion, for example on the at least one data storage device. Therein, changing the first network parameters and the second network parameters is carried out depending on the deviation of the output of the second artificial neural network from the simulated magnetic susceptibility map and depending on a deviation of the output of the first artificial neural network from the second training image.

In this way, the two tasks of the first and the second artificial neural network may be trained with an improved reliability leading to an improved accuracy of their respective outputs. While the first training image comprises both, the influence of the internal tissue magnetic susceptibility sources as well as the external magnetic susceptibility sources, the second training image comprises only the influences of the internal tissue magnetic susceptibility sources but not those of the external magnetic susceptibility sources. It is emphasized, however, that the training of the first and the second artificial network is nevertheless carried out, for example in an end-to-end fashion. This means that the first and the second network parameters are both adapted or changed depending on both said deviations.

In respective embodiments, it becomes particularly transparent that the compensation of the background field effects and the dipole inversion are treated as interrelated problems. Consequently, an accumulation of errors between consecutive steps, which could arise in case the background field correction and the dipole inversion would be treated separately, are avoided.

In several embodiments of the training method, the second training image corresponds to a further artificial magnetic resonance phase image without the influence of the one or more external magnetic susceptibility sources of the sample.

In several embodiments of the training method, changing the first network parameters and the second network parameters comprises computing an end-to-end loss value by evaluating a predefined joint loss function, which depends on the simulated magnetic susceptibility map, on the second training image, on the output of the second artificial neural network and on the output of the first artificial neural network.

For example, the joint loss function may depend on or comprise the deviation of the output of the second artificial neural network from the simulated magnetic susceptibility map and/or the deviation of the output of the first artificial neural network from the second training image. The joint loss function may be a function of two or more individual loss functions, for example a sum of the two or more individual loss functions.

By computing the end-to-end loss value by evaluating the joint loss function, an efficient way to carry out the end-to-end training or the joint common training of the first and the second artificial neural network is achieved.

For example, changing the first network parameters comprises carrying out a first back propagation depending on the end-to-end loss value and/or changing the second network parameters comprises carrying out a second back propagation depending on the end-to-end loss value.

A further aspect of the present disclosure is directed to a method for determining a magnetic susceptibility distribution of a sample. The method comprises generating a first phase image of the sample by using magnetic resonance imaging, MRI, and storing the first phase image in a computer readable fashion, in particular on at least one data storage device. The method comprises generating a second phase image by applying a trained first artificial neural network to the first phase image, wherein the first artificial neural network is trained to remove an influence of one or more external magnetic susceptibility sources from the second phase image or, in other words, from phase images in general, at least partially. The method further comprises generating a magnetic susceptibility map of the sample by applying a trained second artificial neural network to the second phase image, wherein the second artificial neural network is trained or has been trained for carrying out a magnetic dipole inversion, and storing a magnetic susceptibility map in a computer readable fashion, for example on the at least one data storage device.

The MRI is carried out, for example, by using a suitable MRI system. To this end, the sample is, for example, placed in a static magnetic field, which may be generated by a field magnet of the MRI system, for example of a magnetic resonance scanner of the MRI system.

The MRI system or the magnetic resonance scanner may also comprise one or more magnetic gradient field coils to apply magnetic field gradients to the sample, one or more radio frequency, RF, coils for applying radio frequency pulses to the sample. The MRI system or the magnetic resonance scanner may also comprise one or more receiving antennas for receiving a nuclear magnetic resonance signal from the sample. The MRI system may also comprise processing circuitry, which is configured to reconstruct the first phase image, for example depending on a phase of the received nuclear magnetic resonance signal, which is in general a complex signal, and optionally an absolute value image of the sample depending on an absolute value of the received nuclear magnetic resonance signal.

According to the method for determining the magnetic susceptibility distribution of the sample, the second phase image may be stored to the at least one data storage device in a computer readable fashion and the trained second artificial neural network may be applied to the stored second phase image.

In several embodiments of the method for determining the magnetic susceptibility distribution, the first artificial neural network and the second artificial neural network are trained by applying a training method according to the aspect of the present disclosure described above.

For example, the method for determining a magnetic susceptibility distribution may comprise carrying out a training method as described above.

By means of the method for determining the magnetic susceptibility distribution, valuable information regarding the chemical composition and microstructure of the sample is obtained in a particularly accurate, robust and fast way.

According to several embodiments of the method, the first artificial neural network comprises a convolutional neural network, for example a U-net, and/or the second artificial neural network comprises a variational network.

According to a further aspect of the present disclosure, also an MRI system is provided. The MRI system comprises at least one data storage device storing a trained first artificial neural network, which is trained or has been trained to remove an influence of one or more external magnetic susceptibility sources at least partially, and a trained second artificial neural network, which is trained or has been trained for carrying out a magnetic dipole inversion. The MRI system comprises a magnetic resonance scanner and a controller, which is configured to control the magnetic resonance scanner to generate a first phase image of a sample and to store the first phase image to the at least one data storage device. The MRI system further comprises processing circuitry, which is configured to generate a second phase image by applying the trained first artificial neural network to the first phase image and, for example, to store the second phase image to the at least one data storage device. The processing circuitry is further configured to generate a magnetic susceptibility map of the sample by applying the trained second artificial neural network to the second phase image, and to store the magnetic susceptibility map to the at least one data storage device. In several embodiments of the MRI system, the processing circuitry contains the controller at least partially or the controller contains the processing circuitry at least partially. In an exemplary embodiment, the controller and/or the processing circuitry include one or more processors configured to perform the respective functions of the controller and/or processing circuitry.

According to a further aspect of the present disclosure, a data processing device comprising at least one processor is provided. The processor is configured to carry out a training method as described above and/or a method for determining a magnetic susceptibility distribution as described above.

According to a further aspect of the present disclosure, a computer readable storage device storing a computer program is provided. The computer program comprises instructions. When the instructions are executed by at least one processor of a data processing device, the instructions cause the at least one processor to carry out a training method as described above and/or a method for determining a magnetic susceptibility distribution as described above.

FIG. 1 shows a schematic representation of an exemplary embodiment of an MRI system 1 according to the present disclosure.

The MRI system 1 comprises a magnetic resonance scanner 21 with a field magnet 3 that generates a static magnetic field for aligning nuclear spins of a sample 8, for example a patient, in a recording region. The recording region is characterized by an extremely homogeneous static magnetic field, the homogeneity relating in particular to the magnetic field strength or its magnitude. The recording region is positioned in a patient tunnel 2 extending in a longitudinal direction Z through the field magnet 3. The field magnet 3 may, for example, be a superconducting magnet capable of providing magnetic fields with a magnetic flux density of up to 3 T or more. However, permanent magnets or electromagnets with normal conducting coils may be used for lower field strengths. A patient table 7 may be movable within the patient tunnel 2.

Furthermore, the magnetic resonance scanner 21 comprises a gradient coil arrangement 5 with one or more gradient coils that are designed to superimpose location-dependent magnetic fields in the three spatial directions on the static magnetic field for spatial differentiation of the sensed imaging regions in the recording region. The gradient coils of the gradient coil arrangement 5 may, for example, be designed as coils of normal conducting wires, which may, for example, generate mutually orthogonal fields or field gradients in the recording region.

The magnetic resonance scanner 21 comprises a sending coil arrangement, which may for example comprise a body coil 4 as a transmitting antenna, which is configured to radiate a radio frequency, RF, signal into the recording region. The body coil 4 may also be used, in some embodiments, to receive resonant MR signals emitted by the sample 8. In this case, the body coil 4 may also be considered as a part of a readout coil arrangement of the magnetic resonance scanner 21. Optionally, the readout coil arrangement comprises a local coil 6, which may be arranged in the immediate vicinity of the sample 8, for example on the sample 8 or in the patient table 7. The local coil 6 may serve as a receiving antenna alternatively or in addition to the body coil 4.

The MRI system 1 also comprises a control and computing system 22. The control and computing system may comprise a readout controller 10, which may be considered as a part of the readout coil arrangement and is connected to the body coil 4 and/or the local coil 6. Depending on the detected MR signals, the readout controller 10, which may comprise an analog-to-digital converter (ADC), may generate corresponding MR data, in particular in k-space. Processing circuitry 9 of the control and computing system 22 may be configured to evaluate the MR data and, for example, carry out three-dimensional image reconstruction. The processing circuitry 9 may include one or more processors that are configured to execute computer program instructions to perform one or more functions/operations of the processing circuitry 9.

The control and computing system 22 may comprise a sending controller (RF controller) 11, which is connected to and controls the body coil 4 to generate RF pulses, such as excitation pulses and/or refocusing pulses. The control and computing system 22 may comprise a gradient controller 12, which is connected to and controls the gradient coil arrangement 5 to apply slice selection gradients, gradients for frequency and/or phase encoding, diffusion gradients and/or readout gradients.

It is noted that the described structure of the control and computing system 22 is a non-limiting example only. The different required tasks and functions may also be distributed differently.

The MRI System 1 further comprises at least one data storage device (memory) 13 storing a trained first artificial neural network, which is trained to remove an influence of one or more external magnetic susceptibility sources at least partially, and a trained second artificial neural network, which is trained for carrying out a magnetic dipole inversion.

The control and computing system, for example the sending controller 11, the readout controller 10 gradient controller 12, may control the field magnet 3, the gradient coil arrangement 5, the sending coil arrangement and the readout coil arrangement to scanner to generate a first phase image of a sample and to store the first phase image to the at least one data storage device 13.

The processing circuitry 9 is configured to generate a second phase image by applying the trained first artificial neural network to the first phase image, to generate a magnetic susceptibility map of the sample by applying the trained second artificial neural network to the second phase image, and to store the magnetic susceptibility map to the at least one data storage device 13.

Figure 2:
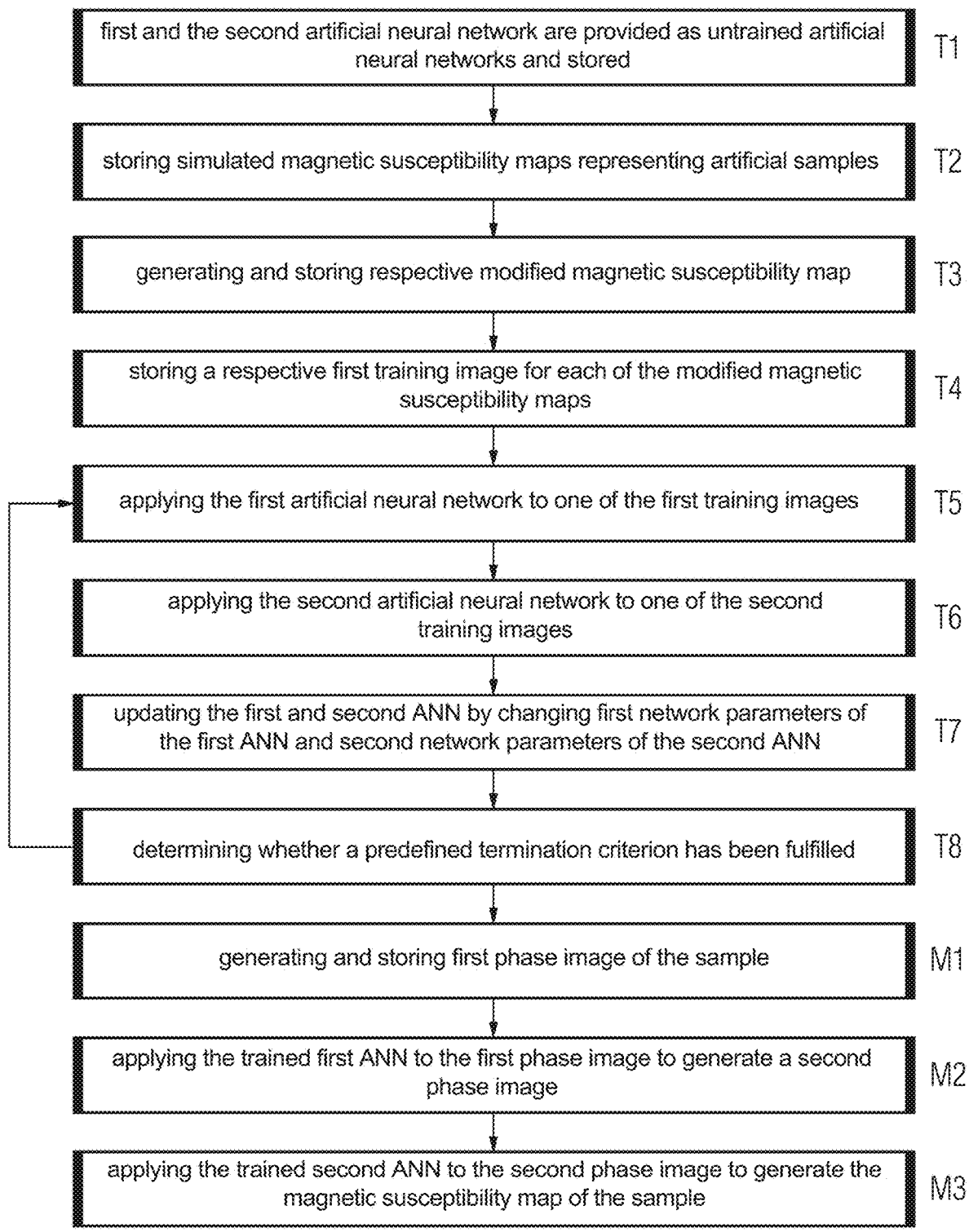
FIG. 2 shows flowchart of training method and a method for determining a magnetic susceptibility distribution of a sample, according to exemplary embodiments of the present disclosure.

FIG. 2 shows a flow diagram comprising training method steps T1 to T8 according to an exemplary embodiment of a training method for training a first artificial neural network and a second artificial neural network to determine a magnetic susceptibility distribution of a sample of the present disclosure and method steps M1 to M3 according to an exemplary embodiment of a method for determining a magnetic susceptibility distribution of a sample of the present disclosure.

In step T1, the first and the second artificial neural network are provided as untrained artificial neural networks and for example stored on the at least one data storage device 13. In step T2, a plurality of simulated magnetic susceptibility maps representing artificial samples are stored on the at least one data storage device 13.

In step T3, a respective modified magnetic susceptibility map is generated and stored to the at least one data storage device 13 for each of the plurality of simulated magnetic susceptibility maps. To this end, an influence of one or more external magnetic susceptibility sources is combined with the respective simulated magnetic susceptibility map.

In step T4, for each of the modified magnetic susceptibility maps, a respective first training image is generated and stored to the at least one data storage device 13 by applying a predetermined QSM model to the respective modified magnetic susceptibility map. Furthermore, for each of the plurality of simulated magnetic susceptibility maps, a respective second training image is generated and stored to the at least one data storage device 13 by applying the predetermined quantitative susceptibility mapping model to the respective simulated magnetic susceptibility map.

In step T5, the first artificial neural network is applied to one of the first training images and in step T6 the second artificial neural network is applied to a resulting output of the first artificial neural network.

In step T7, the first artificial neural network and the second artificial neural network are updated by changing first network parameters of the first artificial neural network and second network parameters of the second artificial neural network depending on a deviation the output of the second artificial neural network from the respective simulated magnetic susceptibility map and depending on a deviation of the output of the first artificial neural network from the respective second training image.

To this end, for example an end-to-end loss value may be computed by evaluating a joint loss function, which depends on the simulated magnetic susceptibility map, the second training image, the output of the first artificial neural network and the output of the second artificial neural network.

In step T8, is may be checked whether a predefined termination criterion is fulfilled, for example whether the end-to-end loss value is smaller than a predefined threshold value. If the termination criterion is not fulfilled, the steps T5 to T8 may be repeated for another one of the first training images et cetera. If the termination criterion is fulfilled, the training may be considered completed.

When the training is completed, the first phase image of the sample 8 may be generated and stored as described above in step M1. In step M2, the trained first artificial neural network is applied to the first phase image to generate a second phase image and in step M3, the trained second artificial neural network may be applied to the second phase image to generate the magnetic susceptibility map of the sample 8, as described above.

The influence of the external magnetic susceptibility sources may be considered in terms of background field, which is caused for example by magnetic field changes outside the sample 8 of interest, such as susceptibility gradients due to tissue-air interfaces or inhomogeneities in the static magnetic field due to imperfect shimming. The background field may even be often orders of magnitude stronger than local fields, also denoted as tissue field, due to the internal magnetic susceptibility sources of the sample and may overlap with local tissue field changes.

In principle, methods may be applied to remove the background fields by exploiting the underlying physical principle that the background phase either satisfies the Laplace equation inside the object of interest or that the background phase is caused by sources outside the object of interest. This means that the internal tissue-related fields can be modeled as non-harmonic components, whereas background fields can be modeled as harmonic components of the total field perturbation. Approaches to background field corrections may be classified based on their assumptions in methods assuming no sources close to boundaries, methods assuming no harmonic internal and boundary fields, and methods that do not employ an explicit boundary assumption, but minimize an objective function based on a norm. One example for satisfying the Laplace equation inside the object of interest, assuming no sources close to boundaries, is sophisticated harmonic artifact reduction for phase data, SHARP. It solves Poisson's equation utilizing the spherical mean value theorem and requires the definition of a spherical kernel radius and a regularization parameter. The SHARP method may also be extended to V-SHARP, utilizing spheres with multiple radii that decrease the size of the kernel towards the brain boundary to reduce artifacts at the edges and thereby extend the usable region of interest.

Another method, assuming no harmonic internal and boundary fields, removes the background field by solving the Laplacian boundary value problem, LBV. Under simple boundary condition assumptions, this method removes the background field while retaining data near the boundary. The simple boundary condition assumptions work in most cases, but can be problematic when the local field is very high near the boundary, for example veins close to the brain surface.

One example in the third group is regularization enabled SHARP, RESHARP, which introduces a Tikhonov regularization at the deconvolution stage. Methods that are based on physical properties of dipole sources outside the object of interest, such as projection onto dipole fields, PDF, also fall in this category because they fit a distribution of external sources to the total field by projecting the field inside the object onto the subspace spanned by all background sources.

Known methods, however, face the limitation of a loss of information at the boundaries, which can be partly mitigated by using varying kernel sizes or by extending field coverage exploiting the harmonic field properties. A fundamental problem is that they require the definition of a mask, separating the object of interest from the background. However, an accurate mask generation is difficult, especially in the abdomen or heart, and leads to either the loss of areas close to boundary regions or residual artifacts due to an incorrect boundary definition. The need for carefully choosing regularization parameters and defining a region of interest currently limit the wide clinical application of QSM.

Deep-learning based techniques can offer an increase in robustness and speed-up in computation. For example, SHARQnet was designed for background field removal using a 3D convolutional neural network and was trained on synthetic background fields overlaid on top of a brain simulation. When the performance was compared to SHARP, RESHARP and V-SHARP, SHARQnet delivered accurate background field corrections on simulations and on in-vivo data. In particular, SHARQnet does not need a brain mask defining the object of interest, providing the benefit of omitting the error-prone brain masking step from the QSM pipeline. This would provide advantages in clinical applications as has already been shown in QSM algorithms that can invert the total field.

Figure 3:
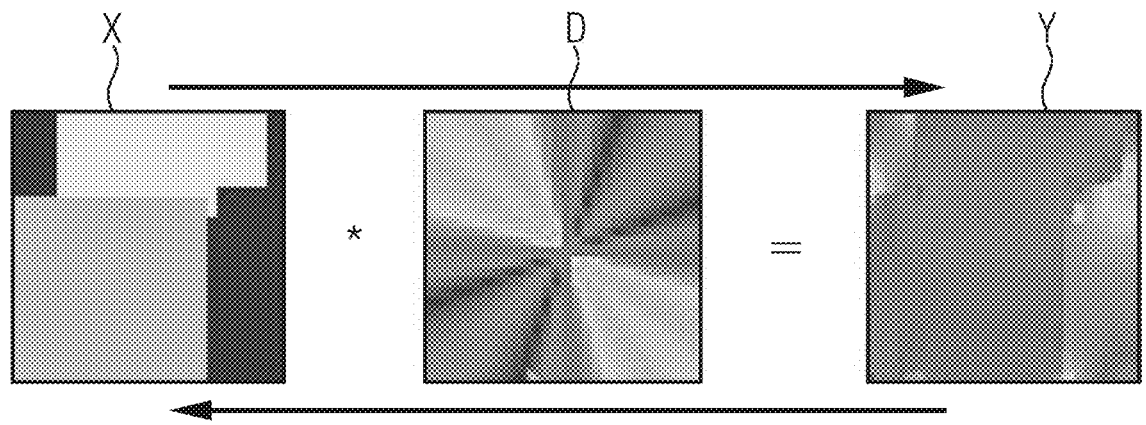
FIG. 3 shows an application of a QSM model in forward and backward direction according to an exemplary embodiment of the present disclosure.
Figure 4:
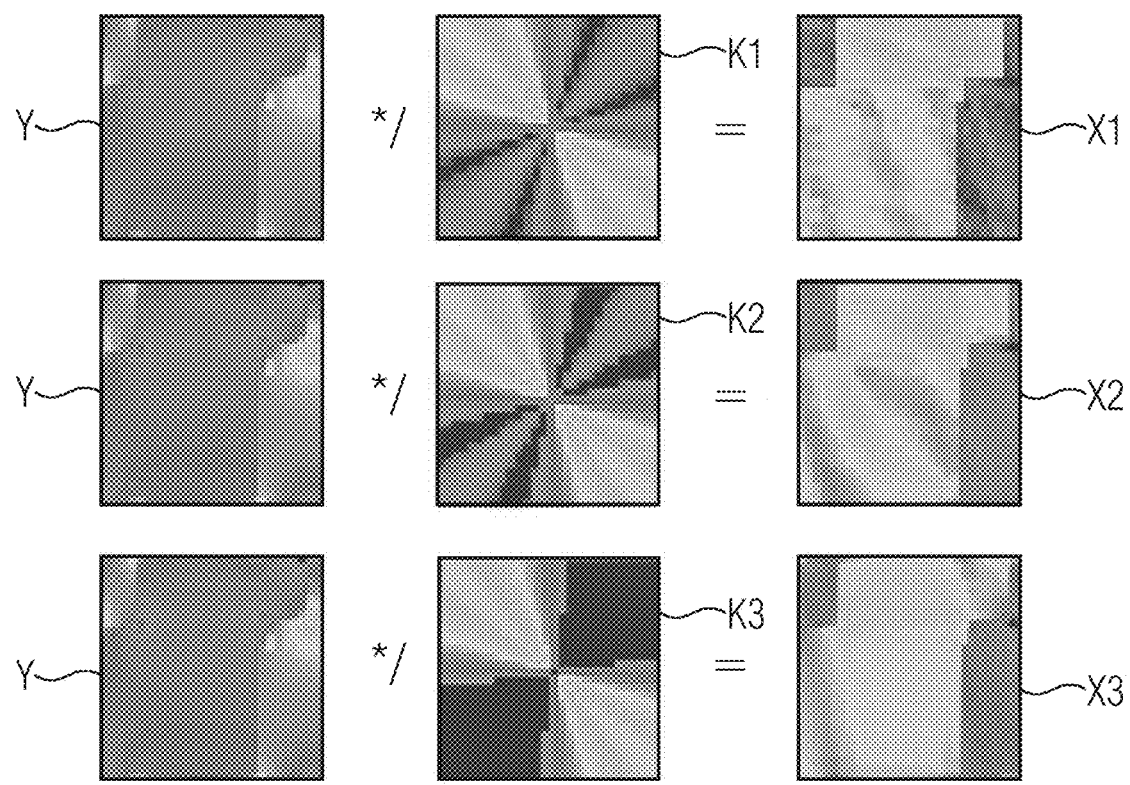
FIG. 4 shows a dipole inversion according to an exemplary embodiment of the present disclosure.

Once the background field is subtracted, one may solve the ill-posed dipole inversion. Therein, the inverse problem of QSM is ill-posed, because the dipole kernel contains zeros on two conic surfaces and small values close to these cones, as one can see for example for the dipole kernel D shown in FIG. 3, which turns the susceptibility map X into the tissue phase image Y. This leads to multiple possible susceptibility distributions that could explain the measured field. This ill-posed problem may be overcome either by acquiring multiple orientations or by regularizing the inversion. FIG. 4 shows schematically the inverse QSM, where Y is turned into respective thresholded k-space division, TKD, solutions X1, X2, X3 for different respective thresholded kernels K1, K2, K3.

Multi orientation techniques may be clinically not feasible because they require the patient to rotate in the magnetic resonance scanner 21 and even the simplest technique, denoted as calculation of susceptibility through multiple orientation sampling, COSMOS, requires at least 3 orientations. These techniques are based on the fact that the magic angle cone follows the rotation of the object in the magnetic resonance scanner 21 and the zero cone surfaces do not intercept leading to an overdetermined field-to-susceptibility problem. COSMOS does not consider microstructural anisotropy effects and more sophisticated techniques that require 6 orientations, such as STI, or 12, such as GLTA may be used.

Single orientation techniques, that are clinically feasible, can be subdivided into three categories. A first category is given by non-iterative k-space techniques, such thresholded k-space division, TKD, and superfast dipole inversion, SDI. These use modifications of the dipole kernel, in which small values are replaced by a constant, in case of TKD without or with correction for the point spread function. This leads to solutions with reduced streaking artifacts but the resultant magnetic susceptibility values are systematically underestimated and there is no universal way of robustly defining the value of this constant due its dependence on the noise level in the data.

A second category is given by iterative strategies in image space, such as MEDI, HEIDI or iLSQR. These techniques are based on the minimization of the L2 norm between the measured magnetic field and the field generated by convolving the dipole with the magnetic susceptibility distribution using standard optimization techniques, for example conjugate gradient or steepest descent. These techniques can also include prior information based on the underlying brain structure, for example in the case of MEDI, or sparsity assumptions.

A third category is given by deep learning-based techniques in image space, such as DeepQSM or QSMnet. The use of artificial neural networks in solving inverse problems is motivated by the fact that an artificial neural network can approximate any continuous function when the network has enough free parameters. Furthermore, the artificial neural network automatically learns necessary features for data processing and, therefore, does not require explicit feature selection that may be sub-optimal. An additional practical advantage of artificial neural networks is the computational efficiency when generating a feed forward output. Deep learning methods for the dipole inversion offer the advantage that they introduce data-driven and self-regulated reconstruction when a deep neural network, for example a 3D-U-net, is end-to-end trained using local field and QSM pairs.

By the techniques according to the present disclosure, a fundamental limitation of currently existing techniques, namely the treatment of the background field correction and the dipole inversion as two independent problems, is overcome. Subtracting the background field before dipole inversion can introduce errors, because these problems are not independent: Strong internal susceptibility sources can also create fields that behave very similar to background fields and would erroneously be removed by background field correction algorithms.

Figure 5:
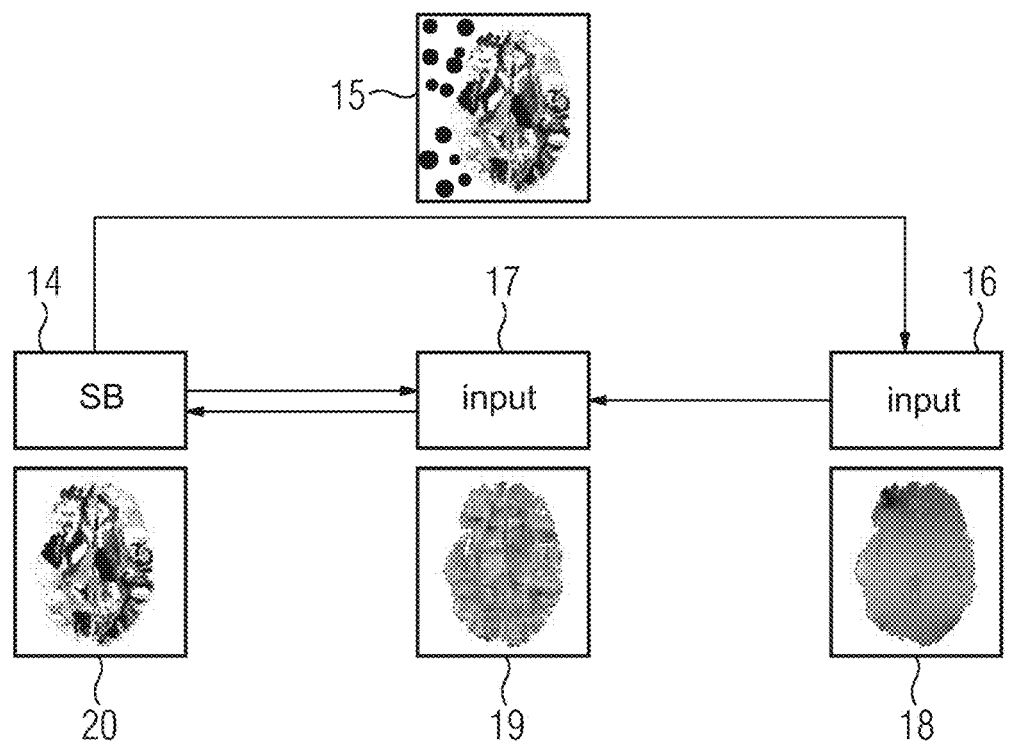
FIG. 5 shows aspects for training artificial neural networks according to a training method according to an exemplary embodiment of the present disclosure.

As illustrated in FIG. 5, the proposed techniques are based on two deep learning architectures given by respective artificial neural networks, which are trained together in an end-to-end fashion for solving the background field removal and dipole inversion together. Both artificial neural networks may utilize realistic simulations of the physical properties of the problems and complex realistic structures. In FIG. 5, the arrows from the left to the right illustrate the training data generation process and the arrows from the right to the left illustrate the joint training of both artificial neural networks in one optimization.

In the data generation process, the QSM forward model is for example applied to synthetic data, for example synthetic brains 14, with and without the influence of external magnetic susceptibility sources 15, to have the respective inputs 16, 17 for the two learning steps. In the learning part, the two artificial neural networks learn the problem in an end-to-end training fashion. Therein, the first artificial neural network is applied to a corresponding first training image 18, which represents a total phase image, and the second artificial neural network is applied to the first artificial neural networks output 19 yielding a prediction 20 for the magnetic susceptibility distribution.

Figure 6:
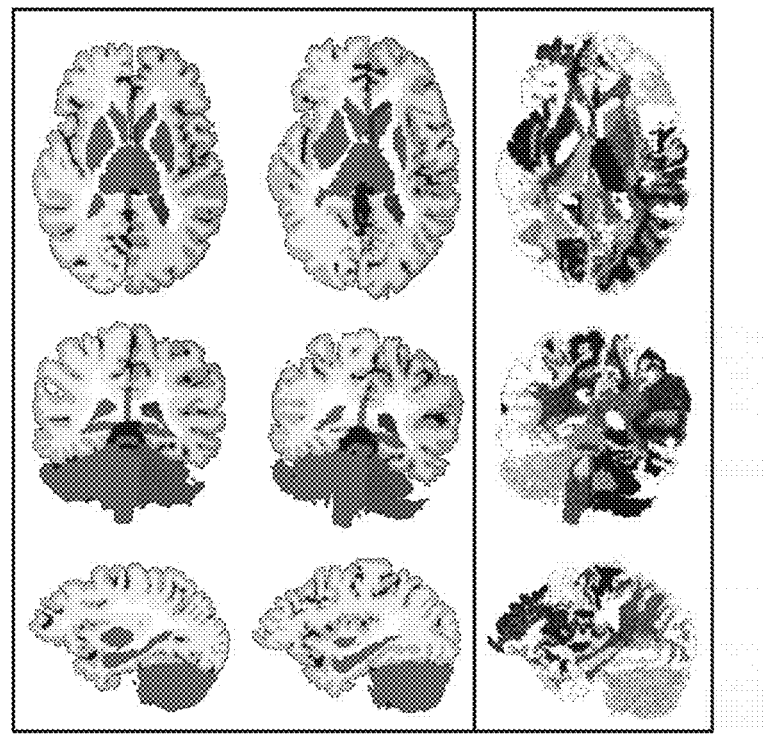
FIG. 6 shows the generation of simulated magnetic susceptibility maps according to an exemplary embodiment of the present disclosure.

The synthetic data may be generated based on a deformation of segmented brain scans using affine transformations and a Gaussian mixture model, which substitutes the class labels with randomly sampled intensities from a prior distribution, as visualized schematically in FIG. 6. In FIG. 6, the left column shows the segmented brain, the middle column shows the deformed brain and the right column shows the synthetic brain.

The synthetic data may for example be generated from various individuals' MPRAGE scans or MP2RAGE scans or other structural scans, which are for example segmented using FreeSurfer. MPRAGE is described in the publication by J. P. Mugler 3rd et al.: "Three-dimensional magnetization-prepared rapid gradient-echo imaging (3D MP RAGE)" Magnetic Resonance in Medicine 15, 1, 152-157. MP2RAGE is described in the publication by J. P. Marques et al.: "Mp2rage, a self bias-field corrected sequence for improved segmentation and t1-mapping at high field." NeuroImage 49, 1271-1281. FreeSurfer is described in the publication by B. Fischl et al.: "Whole Brain Segmentation: Automated Labeling of Neuroanatomical Structures in the Human Brain.", Neuron 33, 341-355.

Figure 7:
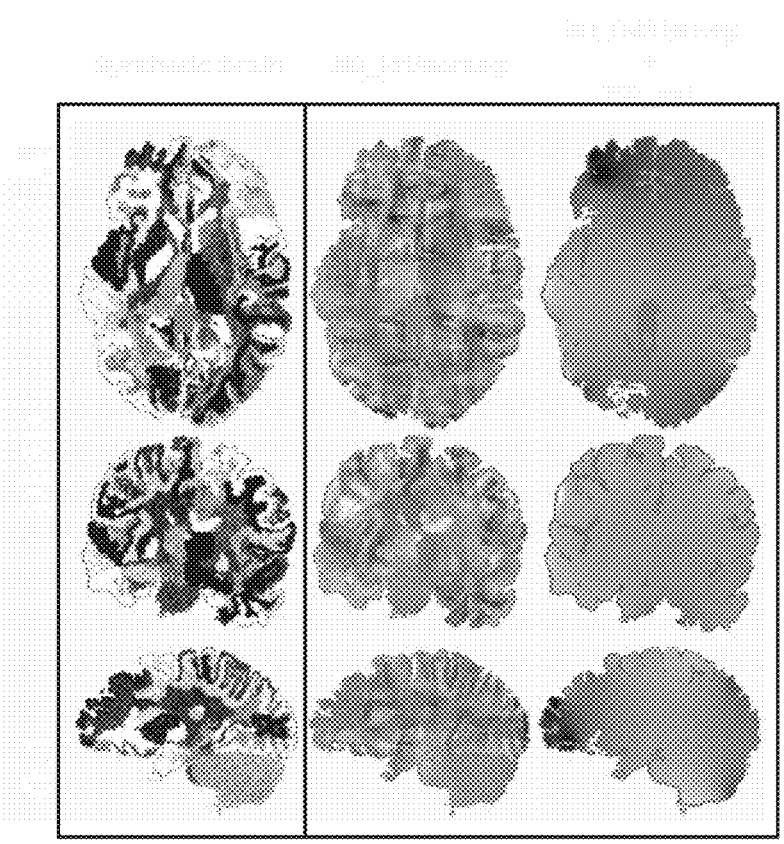
FIG. 7 shows the generation of training images according to an exemplary embodiment of the present disclosure.

The training data generation may comprise applying the QSM forward operation to the FreeSurfer wmparc segmentation maps to simulate data with realistic properties. For the background field removal problem, external sources may be simulated around the brain before convolving it with the QSM forward model, see for example FIG. 7. In FIG. 7, the left column represents the synthetic brain, the middle column shows the data after application of the QSM forward model and the right column shows the data after applying the QSM forward model including the effect of the external magnetic susceptibility sources.

The first stage of the pipeline may use a U-Net as first artificial neural network to learn the background field distribution characteristics. The second stage may use a variational network as second artificial neural network to enable a data-consistent solution of the QSM dipole inversion considering the background field distribution achieved by utilizing the output of the first stage.

For this iterative hybrid model, a regularizer may be learned from the data using convolutional neural networks. In addition to the learned prior term, its loss function may also include a data consistency term, for example the QSM forward model, which helps in applying the model to a variety of input data that would lead to unstable solutions in model-agnostic deep learning solutions. It is noted that the background field is not subtracted initially but fully considered and optimized together with the dipole inversion in a fully feed-forward manner. The different loss functions used at each stage of the pipeline are for example $$E_{UNet} = \frac{1}{N}\sum_{i=1}^{N}\|y_i - \hat{y}_i\|^2,$$

$$E_{VN_k} = \min_{a_k}\left\{\frac{\lambda_k}{N}\sum_{i=1}^{N}(F(\hat{a}_{k_i}) - b_i)^2 + \sum_{i=1}^{N}\Psi_{\theta_k}(\hat{a}_{k_i})\right\},$$

$$E_{VN_N} = \frac{1}{N}\sum_{i=1}^{N}\|z_i - \hat{a}_{M_i}\|^2.$$

Therein, $y_i$ and $\hat{y}_i$ represent the U-net prediction and the respective ground truth sample, $\lambda_k$ represents a trade-off term between data consistency and regularizer at step k, F represents the QSM forward operation, $\Psi_{\theta_k}$ represents the neural network as regularizer at step k, $b_i$ represents the forward operation applied to ground truth, $\hat{a}_{k_i}$ represents a predicted sample at step k, $\hat{a}_M$ represents the predicted sample after M steps of the variational network, and $z_i$ represents a variational network ground truth sample.

For example, an intermediary step in the pipeline may minimize an L2-norm between the ground truth and the U-Net prediction. At each step of the variational network, the prediction may be updated through minimization of the loss, which is for example a trade-off between a data consistency term, containing the forward operation, and a learned regularizer. Finally, after the last step of the variational network, the prediction may be compared to the actual ground truth.

For example, the variational network may be composed of seven iteration-steps with a different shallow U-Net as a regularizer at each step. The training may be done in an end-to-end fashion, on both the background field and dipole inversion architectures jointly. At each training epoch, for example 4500 synthetic brains may be used to learn the problem.

Figure 8:
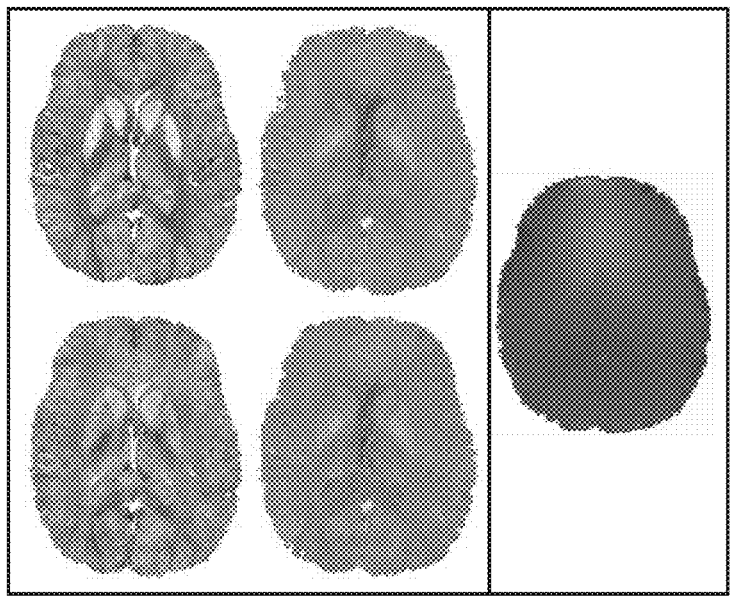
FIG. 8 shows results of a method for determining a magnetic susceptibility distribution of a sample according to an exemplary embodiment of the present disclosure.

FIG. 8 depicts schematically the performance of the technique when applied to a dataset from the QSM challenge 2016, where the QSM reconstruction is compared to the COSMOS ground truth. The left column shows the comparison between the output of the proposed variational network and the corresponding COSMOS ground truth. The center columns show the background-field corrected brain provided by the reconstruction challenge and the prediction from the proposed background field correction stage, which is the input for the dipole inversion model. The input to the background field stage is displayed on the right. The results indicate that the synthetic training data captures both the geometrical and physical properties needed to train deep learning models, which are able to generalize to in vivo data. The proposed techniques are therefore capable of learning the background field correction and dipole inversion from synthetic training data.

The proposed techniques may use for example the combinations of a U-net and a variational network to solve the complete QSM inversion problem in an end-to-end fashion without separating the background field correction step from the dipole inversion resulting in an accurate QSM solution that does not require one to subtract the background field from the data, which would result in the erroneous removal of internal fields resembling external source characteristics.

Exemplary advantages of the proposed techniques include a fast, accurate and robust solution of the QSM inversion although only one orientation is used. The techniques may incorporate spatial structure into the regularization problem and therefore deliver high quality reconstructions that do not suffer from smoothing or noise amplification.

CONCLUSION

The aforementioned description will so fully reveal the general nature of the implementation of the disclosure that others can, by applying knowledge within the skill of the art, readily modify and/or adapt for various applications such specific implementations without undue experimentation and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Each implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of one skilled in the art to affect such feature, structure, or characteristic in connection with other implementations whether or not explicitly described.

The exemplary implementations described herein are provided for illustrative purposes, and are not limiting. Other implementations are possible, and modifications may be made to the exemplary implementations. Therefore, the specification is not meant to limit the disclosure. Rather, the scope of the disclosure is defined only in accordance with the following claims and their equivalents.

The designs of the disclosure may be implemented in hardware (e.g., circuits), firmware, software, or any combination thereof. Designs may also be implemented as instructions stored on a machine-readable medium, which may be read and executed by one or more processors. A machine-readable medium may include any mechanism for storing or transmitting information in a form readable by a machine (e.g., a computing device). A machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

Throughout the drawings, it should be noted that like reference numbers are used to depict the same or similar elements, features, and structures, unless otherwise noted.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. The terms "group (of)", "set (of)", "collection (of)", "series (of)", "sequence (of)", "grouping (of)", etc., and the like in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The phrase "at least one of" with regard to a group of elements may be used herein to mean at least one element from the group consisting of the elements. The phrase "at least one of" with regard to a group of elements may be used herein to mean a selection of: one of the listed elements, a plurality of one of the listed elements, a plurality of individual listed elements, or a plurality of a multiple of individual listed elements.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer.

The term "data", however, is not limited to the aforementioned data types and may take various forms and represent any information as understood in the art.

The terms "processor," "processing circuitry," or "controller" as used herein may be understood as any kind of technological entity that allows handling of data. The data may be handled according to one or more specific functions executed by the processor, processing circuitry, or controller. Further, processing circuitry, a processor, or a controller as used herein may be understood as any kind of circuit, e.g., any kind of analog or digital circuit. Processing circuitry, a processor, or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as processing circuitry, a processor, controller, or logic circuit. It is understood that any two (or more) of the processors, controllers, logic circuits, or processing circuitries detailed herein may be realized as a single entity with equivalent functionality or the like, and conversely that any single processor, controller, logic circuit, or processing circuitry detailed herein may be realized as two (or more) separate entities with equivalent functionality or the like.

As used herein, "memory" is understood as a computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" refers to any type of executable instruction, including firmware.

In one or more of the implementations described herein, processing circuitry can include memory that stores data and/or instructions. The memory can be any well-known volatile and/or non-volatile memory, including read-only memory (ROM), random access memory (RAM), flash memory, a magnetic storage media, an optical disc, erasable programmable read only memory (EPROM), and programmable read only memory (PROM). The memory can be non-removable, removable, or a combination of both.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). Processing circuitry, a processor, or a controller may transmit or receive data over a software-level connection with another processor, controller, or processing circuitry in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

The systems and methods of the disclosure may utilize one or more machine learning models to perform corresponding functions described herein. The term "model" as, for example, used herein may be understood as any kind of algorithm, which provides output data from input data (e.g., any kind of algorithm generating or calculating output data from input data). A machine learning model may be executed by a computing system to progressively improve performance of a specific task. According to the disclosure, parameters of a machine learning model may be adjusted during a training phase based on training data. A trained machine learning model may then be used during an inference phase to make predictions or decisions based on input data.

The machine learning models described herein may take any suitable form or utilize any suitable techniques. For example, any of the machine learning models may utilize supervised learning, semi-supervised learning, unsupervised learning, or reinforcement learning techniques.

In supervised learning, the model may be built using a training set of data that contains both the inputs and corresponding desired outputs. Each training instance may include one or more inputs and a desired output. Training may include iterating through training instances and using an objective function to teach the model to predict the output for new inputs. In semi-supervised learning, a portion of the inputs in the training set may be missing the desired outputs.

In unsupervised learning, the model may be built from a set of data which contains only inputs and no desired outputs. The unsupervised model may be used to find structure in the data (e.g., grouping or clustering of data points) by discovering patterns in the data. Techniques that may be implemented in an unsupervised learning model include, e.g., self-organizing maps, nearest-neighbor mapping, k-means clustering, and singular value decomposition.

Reinforcement learning models may be given positive or negative feedback to improve accuracy. A reinforcement learning model may attempt to maximize one or more objectives/rewards. Techniques that may be implemented in a reinforcement learning model may include, e.g., Q-learning, temporal difference (TD), and deep adversarial networks.

The systems and methods of the disclosure may utilize one or more classification models. In a classification model, the outputs may be restricted to a limited set of values (e.g., one or more classes). The classification model may output a class for an input set of one or more input values. An input set may include road condition data, event data, sensor data, such as image data, radar data, LIDAR data and the like, and/or other data as would be understood by one of ordinary skill in the art. A classification model as described herein may, for example, classify certain driving conditions and/or environmental conditions, such as weather conditions, road conditions, and the like. References herein to classification models may contemplate a model that implements, e.g., any one or more of the following techniques: linear classifiers (e.g., logistic regression or naive Bayes classifier), support vector machines, decision trees, boosted trees, random forest, neural networks, or nearest neighbor.

One or more regression models may be used. A regression model may output a numerical value from a continuous range based on an input set of one or more values. References herein to regression models may contemplate a model that implements, e.g., any one or more of the following techniques (or other suitable techniques): linear regression, decision trees, random forest, or neural networks.

A machine learning model described herein may be or may include a neural network. The neural network may be any kind of neural network, such as a convolutional neural network, an autoencoder network, a variational autoencoder network, a sparse autoencoder network, a recurrent neural network, a deconvolutional network, a generative adversarial network, a forward-thinking neural network, a sum-product neural network, and the like. The neural network may include any number of layers. The training of the neural network (e.g., adapting the layers of the neural network) may use or may be based on any kind of training principle, such as backpropagation (e.g., using the backpropagation algorithm).

The invention claimed is:

1. A training method for training a first artificial neural network and a second artificial neural network to determine a magnetic susceptibility distribution of a sample, the training method comprising:
   storing a simulated magnetic susceptibility map in a computer-readable fashion;
   combining an influence of one or more external magnetic susceptibility sources with the simulated magnetic susceptibility map to generate a modified magnetic susceptibility map;
   storing the modified magnetic susceptibility map in a computer-readable fashion;
   applying a predetermined quantitative susceptibility mapping model to the modified magnetic susceptibility map to generate a first training image;
   storing the first training image in a computer-readable fashion;
   applying the first artificial neural network to the first training image and applying the second artificial neural network to an output of the first artificial neural network; and
   changing first network parameters of the first artificial neural network and second network parameters of the second artificial neural network based on a deviation of an output of the second artificial neural network from the simulated magnetic susceptibility map.

2. The training method according to claim 1, wherein:
   the first training image corresponds to an artificial magnetic resonance phase image including the influence of the one or more external magnetic susceptibility sources of the sample;
   the output of the first artificial neural network corresponds to a modified artificial magnetic resonance phase image of the sample, the influence of the one or more external magnetic susceptibility sources being removed at least partially; and/or
   the output of the second artificial neural network corresponds to a reconstructed magnetic susceptibility map of the sample.

3. The training method according to claim 1, further comprising generating a second training image by applying the predetermined quantitative susceptibility mapping model to the simulated magnetic susceptibility map and storing the second training image in a computer-readable fashion,
   wherein changing the first network parameters and the second network parameters is performed based on the deviation of the output of the second artificial neural network from the simulated magnetic susceptibility map and depending on a deviation of the output of the first artificial neural network from the second training image.

4. The training method according to claim 3, wherein the second image corresponds to a further artificial magnetic resonance phase image of the sample without the influence of the one or more external magnetic susceptibility sources.

5. The training method according to claim 3, wherein changing the first network parameters and the second network parameters comprises evaluating a joint loss function to compute an end-to-end loss value, the joint loss function depending on the simulated magnetic susceptibility map, the second training image, the output of the first artificial neural network, and the output of the second artificial neural network.

6. The training method according to claim 5, wherein:
   changing the first network parameters comprises carrying out a first backpropagation depending on the end-to-end loss value; and/or
   changing the second network parameters comprises carrying out a second backpropagation depending on the end-to-end loss value.

7. The training method according to claim 1, wherein:
   the first artificial neural network comprises a convolutional neural network; and/or
   the second artificial neural network comprises a variational network.

8. A data processing device comprising at least one processor that is configured to perform the method according to claim 1.

9. A non-transitory computer-readable storage medium with an executable program stored thereon, that when executed, instructs a processor to perform the method of claim 1.

10. A method for determining a magnetic susceptibility distribution of a sample, the method comprising:
    performing magnetic resonance imaging to generate a first phase image of the sample and storing the generated first phase image in a computer-readable fashion;
    applying a trained first artificial neural network to the first phase image to generate a second phase image, wherein the first artificial neural network is trained to at least partially remove an influence of one or more external magnetic susceptibility sources; and
    applying a trained second artificial neural network to the second phase image to generate a magnetic susceptibility map of the sample, and storing the magnetic susceptibility map in a computer-readable fashion, wherein the second artificial neural network is trained to carrying out a magnetic dipole inversion.

11. The method according to claim 10, wherein:
    the first artificial neural network comprises a convolutional neural network; and/or
    the second artificial neural network comprises a variational network.

12. The method according to claim 10, wherein the first artificial neural network and the second artificial neural network are trained by:
    storing a simulated magnetic susceptibility map in a computer-readable fashion;

combining an influence of one or more external magnetic susceptibility sources with the simulated magnetic susceptibility map to generate a modified magnetic susceptibility map;

storing the modified magnetic susceptibility map in a computer-readable fashion;

applying a predetermined quantitative susceptibility mapping model to the modified magnetic susceptibility map to generate a first training image;

storing the first training image in a computer-readable fashion;

applying the first artificial neural network to the first training image and applying the second artificial neural network to an output of the first artificial neural network; and changing first network parameters of the first artificial neural network and second network parameters of the second artificial neural network based on a deviation of an output of the second artificial neural network from the simulated magnetic susceptibility map.

13. A data processing device comprising at least one processor that is configured to perform the method according to claim 10.

14. A non-transitory computer-readable storage medium with an executable program stored thereon, that when executed, instructs a processor to perform the method of claim 10.

15. A magnetic resonance imaging (MRI) system comprising:

a memory storing: a trained first artificial neural network having been trained to at least partially remove an influence of one or more external magnetic susceptibility sources, and a trained second artificial neural network having been trained for carrying out a magnetic dipole inversion;

a magnetic resonance scanner and a controller, the controller being configured to control the magnetic resonance scanner to generate a first phase image of a sample and to store the first phase image to the memory; and processing circuitry configured to:
apply the trained first artificial neural network to the first phase image to generate a second phase image;
apply the trained second artificial neural network to the second phase image to generate a magnetic susceptibility map of the sample; and
store the magnetic susceptibility map to the memory.

* * * * *